United States Patent [19]

Greenhall

[11] Patent Number: 4,843,328
[45] Date of Patent: Jun. 27, 1989

[54] APPARATUS FOR USING A TIME INTERVAL COUNTER TO MEASURE FREQUENCY STABILITY

[75] Inventor: Charles A. Greenhall, South Pasadena, Calif.

[73] Assignee: The United States of America as represented by the National Aeronautics and Space Administration, Washington, D.C.

[21] Appl. No.: 184,235

[22] Filed: Apr. 21, 1988

[51] Int. Cl.$^4$ .............................................. G01R 23/02
[52] U.S. Cl. ................................ 324/78 Z; 324/78 D
[58] Field of Search ............... 324/78 Z, 79 R, 79 D, 324/78 D, 78 R; 364/484, 569; 328/129.1, 130.1, 134

[56] References Cited

U.S. PATENT DOCUMENTS

| | | | |
|---|---|---|---|
| 3,704,414 | 11/1972 | Herbst | 324/79 D |
| 4,000,465 | 12/1976 | Sugiyama | 324/166 |
| 4,027,146 | 5/1977 | Gilmore | 235/151.31 |
| 4,084,127 | 4/1978 | Tults | 328/129.1 |
| 4,090,133 | 5/1978 | Klyce et al. | 324/78 D |
| 4,188,665 | 10/1978 | Reinhardt | 324/57 R |
| 4,403,185 | 9/1983 | Charles | 324/78 D |
| 4,484,291 | 11/1984 | Schlösser | 364/484 |
| 4,544,844 | 10/1985 | Hayashi | 324/78 R |
| 4,654,586 | 3/1987 | Evans, Jr. et al. | 324/83 D |

OTHER PUBLICATIONS

Counter Assembly LeCroy, CAMAC Model 4208 8 Channel Wide Range Real-Time TDC, Dec. 1982, pp. 171-172.

The Art of Computer Programming, vol. 3, D. Knuth, Addison-Wostley, 1973, pp. 510-511 and 543.

Primary Examiner—Michael J. Tokar
Assistant Examiner—Louis M. Arana
Attorney, Agent, or Firm—Thomas H. Jones; John R. Manning; Charles E. B. Glenn

[57] ABSTRACT

Apparatus for measuring the relative stability of two signals is disclosed comprising means for mixing the two signals down to a beat note sine wave and for producing a beat note square wave whose upcrossings are the same as the sine wave. A source of reference frequency is supplied to a clock divider and interval counter to synchronize them and to generate a picket fence for providing a time reference grid of period shorter than the beat period. An interval counter is employed to make a preliminary measurement between successive upcrossings of the beat note square wave for providing an approximate time interval therebetween as a reference. The beat note square wave and the picket fence are then provided to the interval counter to provide an output consisting of the time difference between the upcrossing of each beat note square wave cycle and the next picket fence pulse such that the counter is ready for each upcrossing the dead time is avoided. A computer containing an algorithm for calculating the exact times of the beat note upcrossings then computes the upcrossing times.

3 Claims, 3 Drawing Sheets

APPARATUS FOR USING A TIME INTERVAL COUNTER TO MEASURE FREQUENCY STABILITY

ORIGIN OF INVENTION

The invention described herein was made in the performance of work under a NASA contract, and is subject to the provisions of Public Law 96-517 (35 U.S.C. 202) in which the contractor has elected not to retain title.

BACKGROUND OF THE INVENTION

1. Field of the Invention

This invention relates to apparatus for measuring relative stability of two signals and more particularly such apparatus for providing a beat note square wave from two such mixed signals and a picket fence signal providing a time reference grid of period shorter than the beat period to an interval counter and thence to a computer containing an algorithm for calculating the exact times of the beat note upcrossings from the output of the counter.

2. Description of Related Art

In the prior art U.S. Pat. No. 4,118,665 Reinhardt resembles the subject apparatus in that phase deviations of a device under test are converted to time deviations of a sequence of pulses. In both systems these time deviations are measured by an interval counter with respect to a reference pulse train provided by a reference frequency source and a divider. There are two main differences. First, since the front end of Reinhart's system uses the quadrature method of phase detection, phase deviation between two frequency sources can be followed up only up to plus or minus ¼ of a cycle. Since the front end of the present system uses the frequency offset method, phase deviations of arbitrary magnitude can be followed. Secondly, in Reinhardt's system the pulses to be measured necessarily remain coherent with the reference pulses, which are at the same frequency. Again, this limits the possible range of phase measurement. In the present system, because of the operation of the unfolding algorithm, the pulses to be measured need not maintain coherency with the reference picket fence pulses, which are at a higher frequency.

U.S. Pat. No. 4,027,146, Gilmore describes the design of a time interval counter that might be used as a component of the measurement system of the present invention. The present invention consists of apparatus for avoiding the dead time limitation of this type of counter, which needs to reset itself between measurements.

U.S. Pat. No. 4,000,465, Sugiyama describes a digital tachometer that holds its reading even after the instrument shaft has been removed from the rotating object. This device merely counts the number of pulses within a known gate interval whereas the present invention gives precise measurements of all the upcrossing times of a sequence of pulses.

U.S. Pat. No. 4,654,586, Evans, Jr., et al. describes a digital phase meter that measures the lag between two square waves of the same frequency by counting clock pulses between an upcrossing of one square wave and an upcrossing of the other square wave. It is a specialized time interval counter whereas the present invention shows how to use a time interval counter in a novel way.

U.S. Pat. No. 4,544,884, Hayashi describes an improvement in the art of time interval counters that operate by counting the number of clock pulses between two events. It improves the measurement accuracy by accounting for the fractional portions of the clock pulses at the beginning and end of the measurement. The present invention is concerned not with the art of interval counter design but with a novel apparatus that includes an interval counter as one of its elements.

U.S. Pat. No. 4,403,185, Charles detects when the period of a square wave falls below a predetermined threshold. Thus, its output represents only a gross two-state indication of square wave periods whereas the present invention is capable of measuring each period down to the resolution of the interval counter used.

A counter assembly by LeCroy can latch the readings of a free-running counter with the precision of one nanosecond for several input channels. The counter rolls over every $2^{24}$ nanoseconds, about 16.8 milliseconds. In effect it makes its own picket fence with that period and the same unfolding algorithm disclosed in this subject invention happens to apply. A multi-channel frequency stability measurement system built around this unit might be smaller and less expensive than one built around several interval counters in separate chassis. The LeCroy unit never has to stop and reset so that there is no dead time problem such as solved by the subect invention.

SUMMARY OF THE INVENTION

In view of the above prior art an object of the present invention is the provision of a novel and improved apparatus for measuring the relative stability of two signals employing a picket fence for providing a time reference grid of period shorter than the reciprocal of the beat frequency between the two signals.

Another object is the provision of such a system including a computer means containing an algorithm for calculating the exact times of the beat note upcrossings from the output of an interval counter fed by the beat note of the two signals and the picket fence.

These and other objects are accomplished by providing an apparatus for measuring the relative stability of two signals comprising means for mixing the two signals down to a beat note sine wave and then producing a beat note square wave whose upcrossings are the same as said beat note sine wave. A soure of reference frequency is supplied to a clock divider and an interval counter in order to synchronize them and to generate a picket fence for providing a time reference grid of period shorter than the beat period. A preliminary measurement is made in the interval counter between successive upcrossings of the beat note square wave for providing the approximate time interval therebetween as a reference. The beat note square wave and the picket fence are applied to an interval counter to provide an output consisting of the time difference between the upcrossing of each beat note square wave cycle and the next picket fence pulse such that the counter is ready for each upcrossing and dead time is avoided. A computer means contains an algorithm for calculating the exact times of the beat note upcrossings from the output of the counter.

The apparatus thus allows a computation of the exact times of all the beat note upcrossings while avoiding the dead time problem normally present in interval counters. These and other features and objects of the invention will be apparent to those skilled in the art from the

DETAILED DESCRIPTION OF PREFERRED EMBODIMENT

The subject invention employs apparatus and an algorithm to measure the relative stability of two signals that are offset in frequency and mixed down to a beat note of about 1 Hz for example. A commercial time interval counter can be used to measure the relative stability of the two signals that are offset in frequency and mixed down to a beat note of about 1 Hz. To avoid the dead time problem the counter can be set up to read the time interval between each beat note upcrossing and the next pulse of a reference pulse train of 10 Hz for example. The actual upcrossing times are recovered by a simple algorithm whose outputs can be used for computing residuals and Allan variance. A noise floor test yielded a $\Delta f/f$ Allan deviation of $1.3 \times 10^9/\tau$ relative to the beat frequency.

Figure 1:
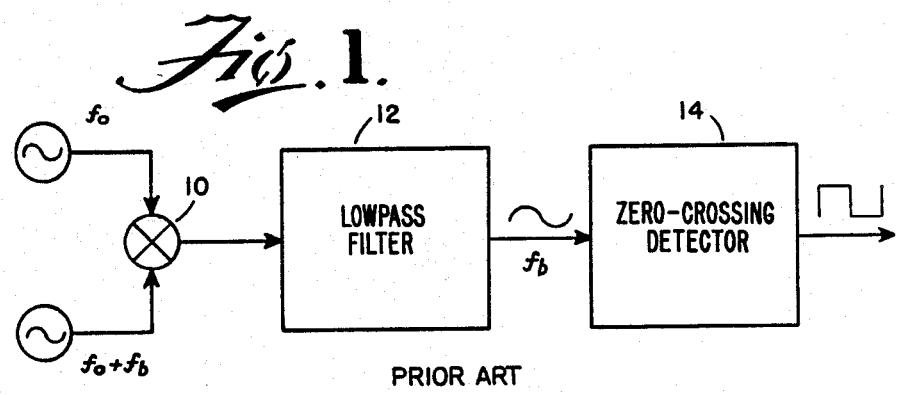
FIG. 1 is a block diagram of an apparatus for the frequency offset or single mixer method of frequency stability measurement of the prior art.

In the frequency offset or single mixer method of frequency stability measurement the two sources to be compared have a small frequency offset $f_b$ of FIG. 1, typically in the neighborhood of 1 Hz. The two sources of nominal frequency $f_o$ are mixed down to a sinusoidal beat note at the offset frequency $f_b$ by the mixer 10 and low pass filter 12. As shown this is a sine wave and is passed through a zero crossing detector 14 which produces a square wave or pulse train at the same frequency. The relative time deviation or fractional frequency deviation of the two sources is equal to $f_b/f_o$ times that of the square wave or more precisely its stream of upcrossings which are spaced approximately one second apart. The present invention deals only with the measurement of these upcrossing times; the analog front end of the system disclosed as prior art in FIG. 1 remains the same.

Figure 2:
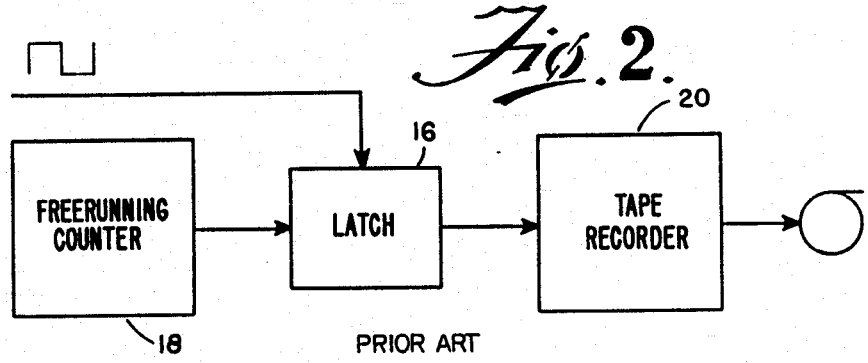
FIG. 2 is a block diagram illustrating a prior art system in which a square wave beat note goes to a custom built digital module that latches the readings of a free running counter at the upcrossings and writes them on a seven track tape which is processed off line by a mainframe computer.

A second prior art system is currently used at the JPL Frequency Standards Laboratory and is illustrated in FIG. 2. The square wave beat note goes to a custom built digital module 16 which latches the readings of a free running 1 MHz 30 bit counter 18 at the upcrossings and writes them on a 7 track tape in the tape recorder 20. The tape is processed off line by a mainframe computer. In this way the upcrossing times are captured with a resolution of 1 microsecond. This system though giving good service has several disadvantages. The counter resolution is too coarse for certain applications. The tape drives are obsolete and not reliable and the off line processing and plotting is slow and cumbersome.

The motivation for the subject invention was the replacement of the prior art system of FIG. 2 with a system of greater accuracy and moderate cost. Although the JPL Frequency Standards Laboratory possesses several prior art time interval counters with nanosecond resolution, the Laboratory did not use these counters in the frequency offset method of frequency stability measurement because of the problem of dead time between measurements: unaided, such a counter can measure only every other period of the beat note, and hence the upcrossing times cannot be located precisely. In a third prior art system, this problem was overcome by using two interval counters in alternation: the first counter measures the odd-numbered periods, and the second counter measures the even-numbered periods. See page 120 of L. G. Bernier, "Theoretical Analysis of the Modified Allan Variance," Proceedings of the 41st Annual Symposium on Frequency Control, 1987 (Library of Congress No. 58-60781), pp. 116–121. Thus, all periods are measured and hence all upcrossing times can be recovered by summation of periods. This prior art system has two disadvantages: first, the period measurement errors tend to accumulate when the summations are performed to obtain the upcrossing times; second, a multichannel system requires two counters per beat-note channel, which increases cost and complexity.

Figure 3:
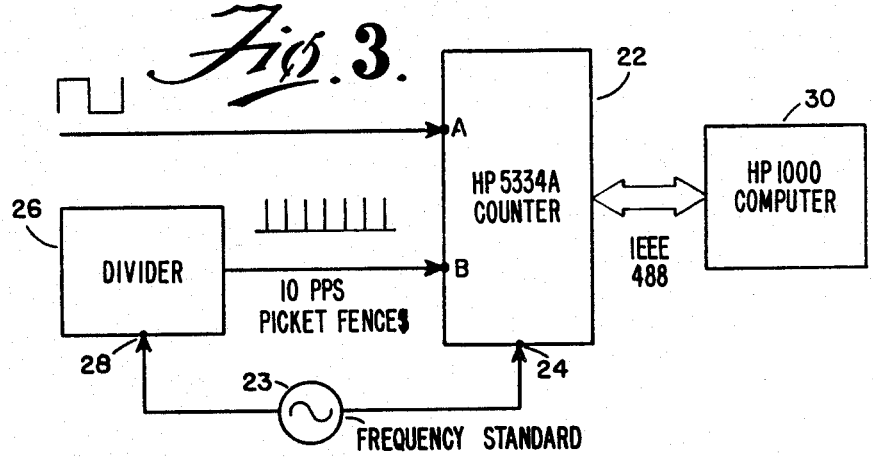
FIG. 3 is a block diagram of the apparatus of the present invention.

In the subject invention, the dead-time problem is overcome by the introduction of one more element, a ten pulse per second reference signal called the picket fence provided by a frequency standard and a divider. This is illustrated in FIG. 3. The beat note square wave goes to the input A of counter 22. The picket fence goes to input B. The same frequency standard 23 drives both the counter at reference input 24 and the divider 26 at reference input 28 to keep the picket fence coherent with the counter 22. The output of counter 22 is processed in computer 30. In a multi-channel system each beat note has its own counter and there is only one picket fence going into all the B inputs of the counters.

To carry out a measurement one first uses the period A function of the counter 22 to make a preliminary measurement of the period p of the square wave. It is permissible to use a long gate time or the 100 reading average function when doing this measurement. Having measured the nominal period one switches the counter to its time interval A to B function and records all subsequent readings. Each reading is the time interval between an upcrossing and the next picket fence pulse. As long as the periods are not too short the counter has time to reset itself between readings and hence no upcrossing is missed. From these raw data the actual upcrossing times can be recovered in software by an algorithm given in detail in the following. Since the method measures times rather than periods, measurement errors do not accumulate.

Figure 4A:
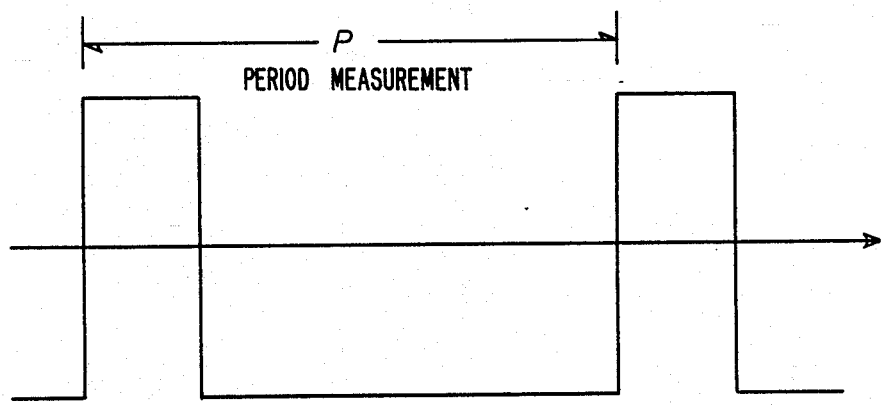
FIGS. 4a and 4b are timing diagrams showing the time evolution of the measurement process of the current invention.
Figure 4B:
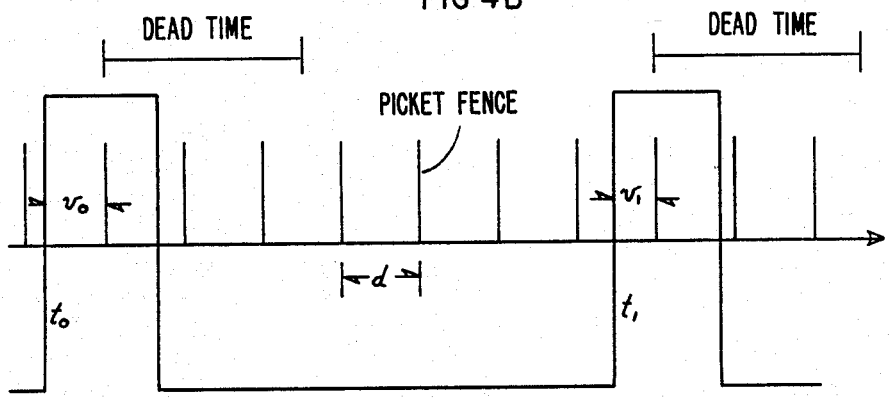

FIG. 4 shows the time evolution of the measurement process. Let d be the picket fence period in FIG. 4b, p the initial period measurement in FIG. 4(a) and $v_o, v_1, v_2 \ldots$ the sequence of time interval data. Let $t_o, t_1, t_2 \ldots$ be the actual upcrossing times relative to some time origin, perhaps one of the picket fence pulses. Each $t_n$ differs from the corresponding $-v_n$ by an unknown integer multiple of d and we would like to resolve the ambiguities. Let $\Delta$ denote the backward difference operator, that is, $\Delta t_n$ equals $t_n - t_{n-1}$. We make the following assumptions about the beat note. Assumption 1: The first period $\Delta t_1$ differs from p by less than $d/2$, and any two successive periods $\Delta t_{n-1}$, $\Delta t_n$ differ by less than d/2. This guarantees that the 100 millisecond ambiguity can be uniquely resolved. Assumption 2: Each period $\Delta t_n$ is greater than d+g where g is the maximum dead time of the counter. This guarantees that no upcrossing is missed.

Since the $t_n$ increase quickly and may contain important information in their least significant digits, they are awkward to compute, store and use. Accordingly, the algorithm actually computes the sequence of time residuals defined by $x_n = t_n - t_o - np$ where n=0, 1, 2 ... At the core of the algorithm is the signed residue function Smod(x, m) which is defined to be x minus the closest integer multiple of m to x. For example, Smod (3, 5) = Smod(−7, 5) = −2. If x is half way between the two integer multiples of m then it doesn't matter whether Smod (x, m) is defined to be m/2 or −m/2. The following algorithm incorporates a small amount of error handling to prevent one bad input from spoiling the subsequent inputs.

---
Unfolding Algorithm
---

```
!   Global parameters: p, d
Do for n = 0, 1, 2, ...
    Read v_n
    Call Unfold (n, v_n, x_n)
    Output x_n
Enddo
Subroutine Unfold (n, v, x)
! Inputs: n, v
! Output: x
! Local variables
!   du  : current Δu = −Δv
!   dx  : current Δx
!   dua: du anchor
!   dxa: dx anchor
!   ddx: current dx - dxa or second difference
!   v1: previous v
!   x1: previous x
1.  If n = 0 then
       ! Initialize
2.        dua = p
3.        dxa = 0
4.        x = 0
5.  Else
6.        du = v1 − v
7.        ddx = Smod (du − dua, d)
8.        dx = dxa + ddx
9.        x = x1 + dx
       ! Error handling
10.       If |ddx| < d/4 then
             ! Data OK, drag anchor along
11.          dxa = dx
12.          dua = du
13.       Endif
14. Endif
15. x1 = x
16. v1 = v
17. Return.
```

Let us first discuss the algorithm with the error check lines 10 and 13 removed. (Lines 11 and 12 remain.) A proof of correctness of the unfolding algorithm follows.

Proof of Correctness of the Unfolding Algorithm

To avoid confusion let the output of the algorithm be denoted by $X_n$, while $x_n$ is still defined by $x_n = t_n - t_o - np$. The error correction lines 10 and 13 are ignored. We shall prove by induction that $X_n = x_n$ for all n. For n=0, both quantities are zero. For n=1 we have $$du = -\Delta v_1 = \Delta t_1 \pmod{d}$$
$$ddx = Smod(\Delta t_1 - p, d) = \Delta t_1 - p \text{ (assumption 1)}$$
$$= x_1.$$

Therefore, $X_1 = x = x_1$ since dxa = x1 = 0. For n>1 assume the algorithm is correct up to n−1. Then $$dua = -\Delta v_{n-1} = \Delta t_{n-1} \pmod{d},$$
$$du = -\Delta v_n = \Delta t_n \pmod{d},$$
$$ddx = Smod(\Delta^2 t_n, d) = \Delta^2 t_n \text{ (assumption 1)}$$
$$= \Delta^2 x_n,$$
$$dxa = \Delta x_{n-1}, x1 = x_{n-1},$$
$$dx = \Delta x_{n-1} + \Delta^2 x_n = \Delta x_n,$$
$$X_n = x = x_{n-1} + \Delta x_n = x_n.$$

This concludes the proof.

The algorithm accomplishes its purpose by forcing the second difference $\Delta^2 x_n$ to be less than d/2 in absolute value in accordance with the first foregoing assumption and also equal to $-\Delta^2 v_n$ modulo d.

Experience has shown that some protection against bad data is also needed. Table 1 shows what can happen if there is one error with magnitude slightly greater than d/4.

TABLE 1

| n | v | v1 | x1 | dua | dxa | du | ddx | dx | x |
|---|---|----|-----|-----|-----|-----|-----|-----|-----|
| 0 | 0 |    |     | line 9 not applicable |  |  |  |  | 0 |
| 1 | 0 | 0  | 0   | 10  | 0   | 0   | 0   | 0   | 0 |
| 2 | −.26 | 0 | 0 | 0 | 0 | .26 | .26 | .26 | .26 |
| 3 | 0 | −.26 | .26 | .26 | .26 | −.26 | .48 | .74 | 1.00 |
| 4 | 0 | 0 | 1.00 | −.26 | .74 | 0 | .26 | 1.00 | 2.00 |
| 5 | 0 | 0 | 2.00 | 0 | 1.00 | 0 | 0 | 1.00 | 3.00 |
| 6 | 0 | 0 | 3.00 | 0 | 1.00 | 0 | 0 | 1.00 | 4.00 |

The underlined value of ddx(n=3) has been converted by Smod from −0.52d to 0.48d. As a result the $x_n$ start to increase linearly. This can cause computational problems for a program that analyzes the $x_n$. The error check with threshold d/4 anchors the current bad data to the last good data. If $\Delta x_n$ is the anchor dxa at time n, and the condition of line 10 is satisfied at times n and n+1, then $\Delta x_{n+1}$ is within d/2 of $\Delta x_m$. In the example, the anchor stays at $\Delta x_1$ for n=2 and 3. At n=4 it is pulled up again. As a result the $x_n$ go back to zero after time 2.

A single channel hardware and software system was set up to evaluate the method (FIG. 3). An HP 1000 computer collects the data in real time and stores the output of the unfolding algorithm on its disk. Simultaneously a user can cause any portion of the test to be processed into residuals and Allan deviation. To measure the ultimate noise floor of the technique and to test the integrity of the measurement system, the beat note square wave was simulated by the output of a stable low rate pulse generator assembled from a synthesizer, a divider and another counter. The generator's period, which could be programmed to the nearest nanosecond, was chosen to be 0.938196601s = (10−r)d, where d equals 0.1s, the picket fence period, and r is the golden ratio $(\sqrt{5}-1)/2$. This period guarantees a good mix of counter readings $v_n$. See D. E. Knuth, The Art of Computer Programming, Volume 3, Addison-Wesley, 1973, pp. 510-11, and 543. If a conveniently available 1 PPS signal had been used, the counter would have always been reading the same value. The same frequency source, a cesium standard, was used for driving the counter, the picket fence and the pulse generator. Thus, the results include instabilities and errors of the pulse generator, picket fence divider, and counter, but not of the measurement time base that drives these components.

Figure 5:
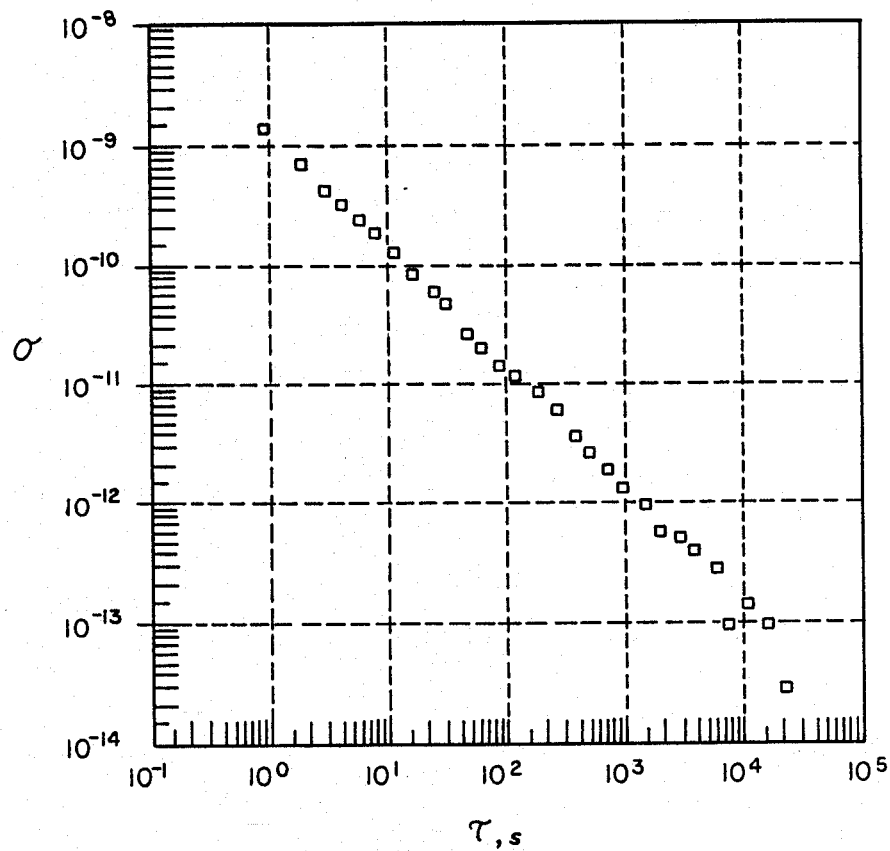
FIG. 5 is a graph of the Allan deviation noise floor.

A test of duration 108600 s was carried out. The accumulated time residuals, with the mean frequency offset removed, remained within a 6 ns band over the entire run. The Allan deviation shown in FIG. 5 is approximately $1.3 \times 10^{-9}/\tau$ for $\tau$ between 0.94 s and 11,500 s. This shows that-all the equipment maintained time coherence at the nanosecond level and that the counter met its specifications.

To see what this means for an actual test of frequency sources, recall that these numbers must be scaled down accordingly to the source and beat frequencies. For example, if two 1 MHz sources with a 1 Hz offset were being tested, the digital part of the measurement system would contribute a $\Delta f/f$ Allan deviation of $1.3 \times 10^{-15}/\tau$.

The technique given here is a method and apparatus for measuring the stability of the square wave produced by mixing two offset frequency sources and passing the low-frequency sine wave through a zero-crossing detector. In contrast to the prior art system illustrated in FIG. 2, which uses custom digital hardware and has microsecond resolution, the system illustrated in FIG. 3 uses commercial hardware of moderate cost (under $3000 per counter) with a IEEE-488 interface, and has nanosecond resolution. While only a particular preferred embodiment has been discussed, it should be understood that numerous variations and alternate embodiments will occur to those skilled in the art. Accordingly, it is intended that the invention be limited only in terms of the appended claims.

I claim:

1. Apparatus for measuring the relative stability of two signals comprising means for mixing said two signals down to a beat note sine wave, and for producing a beat note square wave whose upcrossings are the same as said beat frequency sine wave; a source of reference frequency; a clock divider; an interval counter; means for supplying said reference frequency to said clock divider and interval counter to synchronize them and to generate a picket fence for providing a time reference grid of period shorter than the period of said beat note; means for making a preliminary measurement in said interval counter between successive upcrossings of said beat note square wave for providing the approximate time interval therebetween as a reference period; means for supplying said beat note square wave and said picket fence to said interval counter to provide an output consisting of the time difference between the upcrossing of each beat note square wave cycle and the next picket fence pulse, such that said counter is ready for each upcrossing and dead time is avoided; and computer means containing an algorithm for calculatin the exact times of said beat note upcrossings from the output of said counter.

2. Apparatus for measuring the relative stability of two signals comprising means for mixing said two signals offset in frequency down to a beat note sine wave; low pass filtering and zero crossing detector means for producing a beat note square wave whose upcrossings are the same as said beat note sine wave; reference frequency means for generating a reference frequency; a clock divider means; means for applying said reference frequency to said clock divider in order to generate a picket fence for providing a time reference grid of period shorter than the period of said beat note; interval counter means for calculating the time interval between each beat note square wave upcrossing and the next pulse of said picket fence; means for providing a reference period in said interval counter by making a preliminary measurement between successive upcrossings of said beat note square wave for providing the approximate interval therebetween; means for providing said reference frequency to said interval counter for synchronizing it with the output of said clock divider, the output of said interval counter then consisting of the time difference between the upcrossing of each beat note square wave cycle and the next picket fence pulse, such that said counter is ready for each upcrossing and dead time is avoided; computer means containing an algorithm for calculating the exact times of the upcrossings from said reference period and said time intervals between said upcrossings and said picket fence.

3. An algorithm for use in claims 1 or 2, including the steps of putting a reference period between successive upcrossings of a beat note square wave in memory, calculating the negative of the time interval between each subsequent square wave beat note upcrossing and the next subsequent picket fence pulse from said interval counter, and adding the correct multiple of the picket fence period to said negative in order to make the current period conform as near as possible to the previous period in order to provide accurate measurements of the times of the upcrossings.

* * * * *